(12) United States Patent
Lee et al.

(10) Patent No.: US 9,530,658 B2
(45) Date of Patent: *Dec. 27, 2016

(54) CONTINUOUS PLASMA ETCH PROCESS

(71) Applicant: Lam Research Corporation, Fremont, CA (US)

(72) Inventors: Wonchul Lee, San Ramon, CA (US); Qian Fu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,115

(22) Filed: Aug. 12, 2015

(65) Prior Publication Data

US 2015/0348792 A1 Dec. 3, 2015

Related U.S. Application Data

(63) Continuation of application No. 13/875,146, filed on May 1, 2013, now Pat. No. 9,129,902.

(51) Int. Cl.
| | | |
|---|---|---|
| *H01L 21/302* | (2006.01) | |
| *H01L 21/3065* | (2006.01) | |
| *H01L 21/311* | (2006.01) | |
| *H01L 21/67* | (2006.01) | |
| *H01L 21/3213* | (2006.01) | |
| *H01J 37/32* | (2006.01) | |

(52) U.S. Cl.
CPC ......... *H01L 21/3065* (2013.01); *H01J 37/321* (2013.01); *H01J 37/32449* (2013.01); *H01L 21/31116* (2013.01); *H01L 21/32137* (2013.01); *H01L 21/67069* (2013.01); *H01J 2237/334* (2013.01)

(58) Field of Classification Search
CPC ............... H01L 21/31116; H01L 21/32137; H01L 21/67069; H01L 21/31138; H01L 21/3065; H01L 21/32449; H01L 21/321; H01J 37/32082; H01J 37/32449
USPC ... 438/706, 710, 712, 714, 720; 156/345.43, 156/345.44, 345.45
See application file for complete search history.

(56) References Cited

U.S. PATENT DOCUMENTS

| 5,681,424 A | 10/1997 | Saito et al. |
| 7,446,050 B2 | 11/2008 | Chang et al. |

(Continued)

OTHER PUBLICATIONS

Notice of Allowance dated May 8, 2015 from U.S. Appl. No. 13/875,146.

(Continued)

*Primary Examiner* — Lan Vinh
(74) *Attorney, Agent, or Firm* — Beyer Law Group LLP

(57) ABSTRACT

A method for processing a substrate in a process chamber is provided. A plurality of cycles is provided to process the substrate, wherein each cycle comprises the steps of providing a flow of a first process gas into the process chamber, stopping the flow of the first process gas into the process chamber, providing a flow of a first transition gas into the process chamber, wherein the first transition gas neutralizes a component of the first process gas, stopping the flow of the first transition gas into the process chamber, providing a flow of a second process gas into the process chamber, stopping the second process gas into the process chamber, and maintaining a continuous plasma during the cycle.

22 Claims, 5 Drawing Sheets

(56) References Cited

U.S. PATENT DOCUMENTS

| | | | | |
|---|---|---|---|---|
| 8,344,166 B2* | 1/2013 | Doi | ............... | C07D 317/54 |
| | | | | 549/446 |
| 9,129,902 B2* | 9/2015 | Lee | ............... | H01L 21/3065 |
| 2003/0207579 A1 | 11/2003 | Rattner et al. | | |
| 2005/0275944 A1* | 12/2005 | Wang | ............... | B82Y 20/00 |
| | | | | 359/576 |
| 2007/0243714 A1* | 10/2007 | Shin | ............... | H01L 21/31122 |
| | | | | 438/706 |
| 2010/0190350 A1* | 7/2010 | Yatsuda | ............... | H01J 37/32091 |
| | | | | 438/710 |
| 2011/0177669 A1* | 7/2011 | Lee | ............... | H01J 37/321 |
| | | | | 438/400 |
| 2011/0297533 A1* | 12/2011 | Mori | ............... | C23F 4/00 |
| | | | | 204/192.33 |
| 2014/0329391 A1 | 11/2014 | Lee et al. | | |

OTHER PUBLICATIONS

Office Action dated Mar. 12, 2015 from U.S. Appl. No. 13/875,146.

* cited by examiner

CONTINUOUS PLASMA ETCH PROCESS

CROSS REFERENCE TO RELATED APPLICATIONS

This application is a continuation of and claims priority to pending U.S. application Ser. No. 13/875,146 filed on May 1, 2013 and entitled "Continuous Plasma Etch Process," which is incorporated herein by reference in its entirety for all purposes.

BACKGROUND OF THE INVENTION

The present invention relates to the formation of semiconductor devices. More specifically, the invention relates to the formation of semiconductor devices require etching features.

During semiconductor wafer processing during an etch different plasma processes may be used. Sometimes a plasma is turned off when going from one process to another.

SUMMARY OF THE INVENTION

To achieve the foregoing and in accordance with the purpose of the present invention, a method for processing a substrate in a process chamber is provided. A plurality of cycles is provided to process the substrate, wherein each cycle comprises the steps of providing a flow of a first process gas into the process chamber, stopping the flow of the first process gas into the process chamber, providing a flow of a first transition gas into the process chamber, wherein the first transition gas neutralizes a component of the first process gas, stopping the flow of the first transition gas into the process chamber, providing a flow of a second process gas into the process chamber, stopping the second process gas into the process chamber, and maintaining a continuous plasma during the cycle.

In another manifestation, an apparatus is provided. A plasma processing chamber is provided comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. At least one RF power source is electrically connected to the at least one electrode. A bias voltage source provides a bias voltage to the substrate support. A gas source is in fluid connection with the gas inlet. A controller is controllably connected to the gas source, the bias voltage source, and the at least one RF power source. The controller comprises at least one processor and computer readable media executable by the at least one processor. The computer readable media comprises computer readable code configured to direct the plasma processing chamber to provide a plurality of cycles, wherein each cycle comprises the steps of providing a flow of a first process gas into the process chamber, stopping the flow of the first process gas into the process chamber, providing a flow of a first transition gas into the process chamber, wherein the first transition gas neutralizes a component of the first process gas, stopping the flow of the first transition gas into the process chamber, providing a flow of a second process gas into the process chamber, stopping the second process gas into the process chamber, and maintaining a continuous plasma during the cycle.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
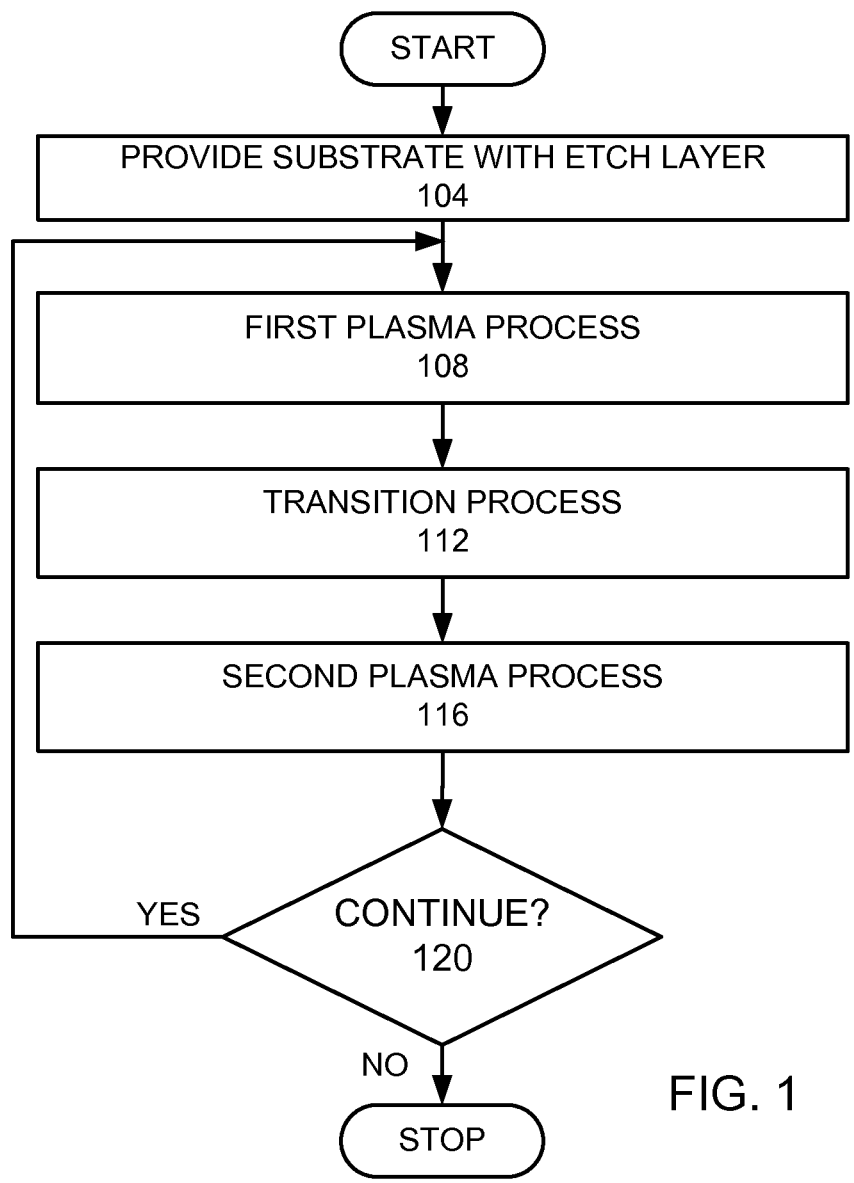
FIG. 1 is a high level flow chart of a process that may be used in an embodiment of the invention.

To facilitate understanding, FIG. 1 is a high level flow chart of a process that may be used in an embodiment of the invention which etches features. A substrate is provided with an etch layer (step 104). A first plasma process is provided (step 108). A transition process is provided (step 112). A second plasma process is provided (step 116). The cycles are repeated (step 120) if more etching with this process is required.

EXAMPLE

Figure 2A:
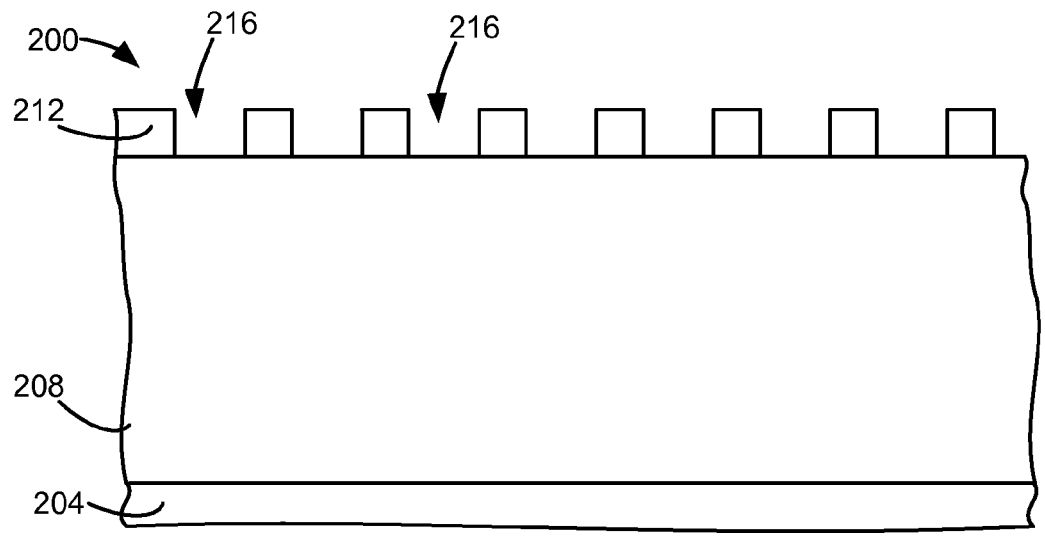
FIGS. 2A-C are schematic cross-sectional views of a stack processed according to an embodiment of the invention.

In an example of an implementation of the invention, a substrate is provided with an etch layer under a mask with features into a plasma processing device (step 104). FIG. 2A is a cross sectional view of a stack 200 with a substrate 204 disposed below an etch layer 208, disposed below a patterned mask 212 with features 216. In this example, the etch layer 208 is silicon. The etch layer 208 may be a silicon layer, such as polysilicon, deposited on the substrate 204, or may be part of the substrate 204. The patterned mask 212 is formed from silicon oxide. In various embodiments, one or more layers may be placed between the various layers. For example, one or more layers, such as an etch stop layer, may be between the etch layer 208 and the substrate 204.

Figure 3:
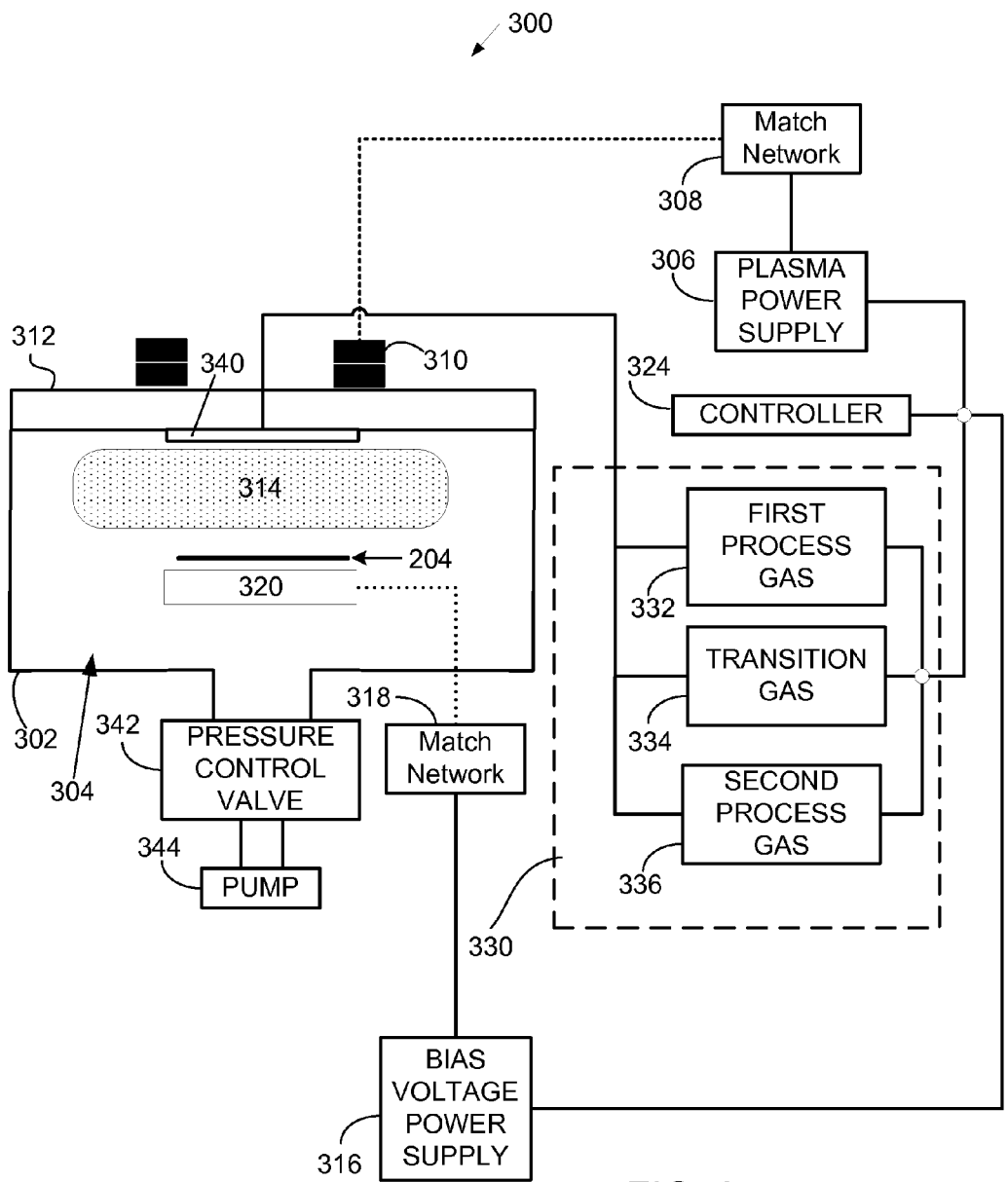
FIG. 3 is a schematic view of a plasma processing chamber that may be used in practicing the invention.

FIG. 3 schematically illustrates an example of a plasma processing system 300 which may be used to perform the process of etching the etch layer 208 in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204 which is supported by the electrode 320. A controller 324 sets points for the plasma power supply 306 and the wafer bias voltage power supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a first process gas source 332, a transition gas source 334, and a second process gas source 336. The first process gas may have some of the same components as the transition gas or second process gas. In such a case, instead of having a separate gas source, the gas source 330 provides various components of the first process gas, transition gas, and second process gas, as will be described below. The gas sources 332, 334, and 336 are in fluid connection with plasma processing chamber 304 through a gas inlet, such as a shower head 340. The gas inlet may be located in any advantageous location in the plasma processing chamber 304, and may take any form for injecting gas. Preferably, however, the gas inlet may be configured to produce a "tunable" gas injection profile, which allows independent adjustment of the respective flow of the gases to multiple zones in the plasma process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. of Fremont, Calif., may be used to practice an embodiment of the invention.

Figure 4:
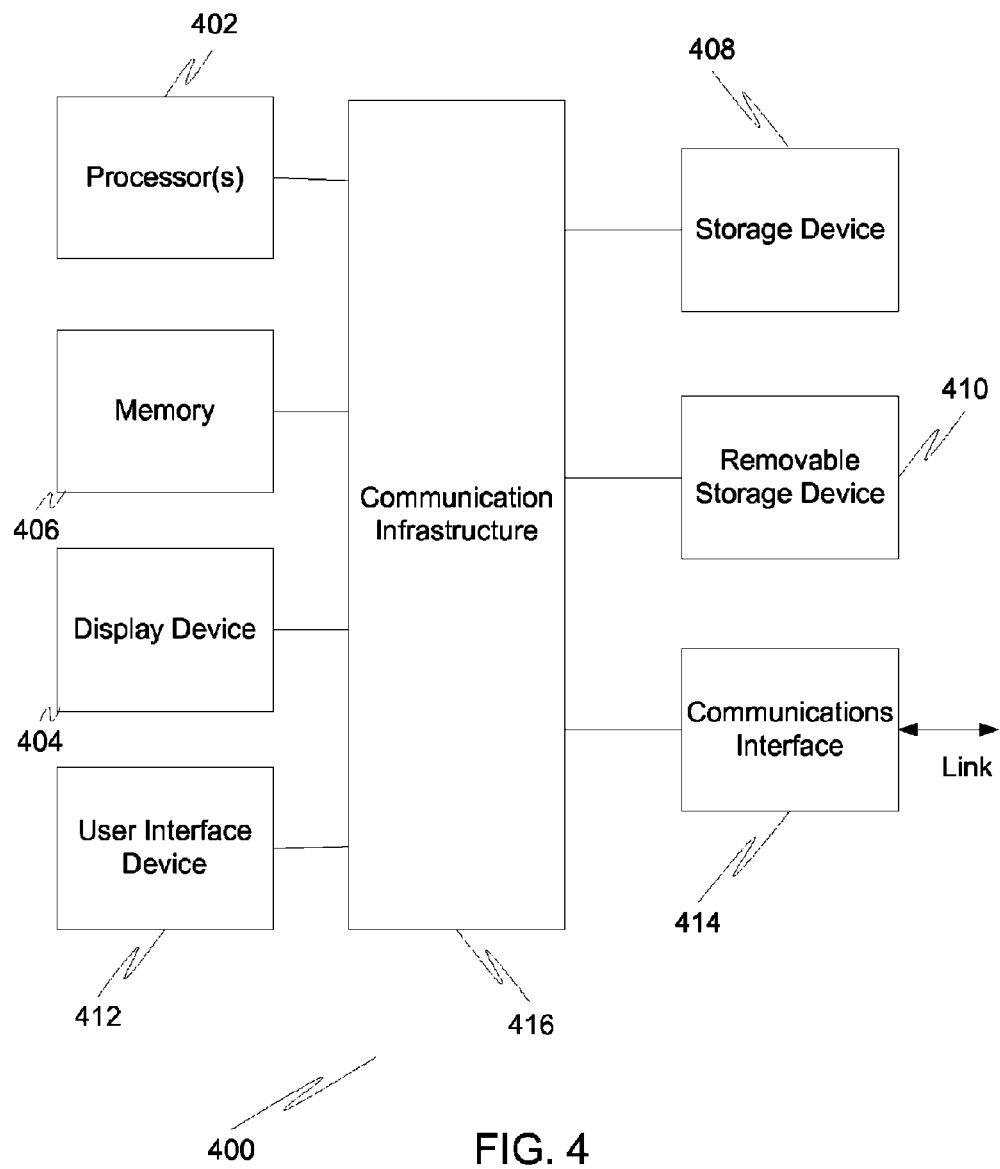
FIG. 4 illustrates a computer system, which is suitable for implementing a controller used in embodiments of the present invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The first plasma process is provided (step 108). A pressure of 10 mTorr is provided. Transformer coupled plasma (TCP) power of 100 watts is provided. A pulsed bias voltage of 500 volts is applied with a 15% duty cycle at 100 Hz. A first plasma process gas of 100 sccm $CF_4$ is flowed from the first process gas source 332 into the plasma processing chamber 304. The gas is flowed for 7 seconds. In other embodiments, the bias may be provided in a continuous mode.

The transition process is provided (step 112). A pressure of 5 mTorr is provided. TCP power of 150 watts is provided. No bias voltage is provided. A transition gas of 100 sccm $N_2$ is flowed from the transition gas source 334 into the plasma processing chamber 304. The gas is flowed for 1 second.

The second plasma process is provided (step 116). A pressure of 20 mTorr is provided. TCP power of 600 watts is provided. No bias voltage is provided. A second plasma process gas of 200 sccm $O_2$ is flowed from the second process gas source 336 into the plasma processing chamber 304. The gas is flowed for 10 seconds.

In this example, a second transition process is provided after the second plasma process. A pressure of 5 mTorr is provided. TCP power of 150 watts is provided. No bias voltage is provided. A transition gas of 200 sccm Ar is flowed from the gas source 330 into the plasma processing chamber 304. The gas is flowed for 3 seconds.

In a third plasma process after the second transition process a pressure of 3 mTorr is provided. Transformer coupled plasma (TCP) power of 300 watts is provided. A pulsed bias voltage of 850 volts is applied with a 25% duty cycle at 100 Hz. A third plasma process gas of 100 sccm $Cl_2$ is flowed from the gas source 330 into the plasma processing chamber 304. The gas is flowed for 10 seconds.

Figure 2B:
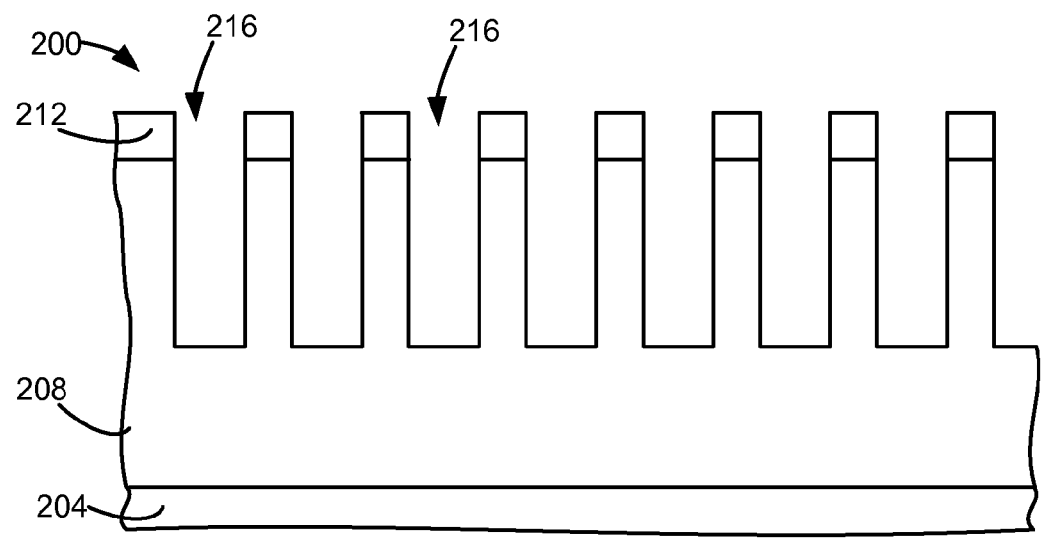
Figure 2C:
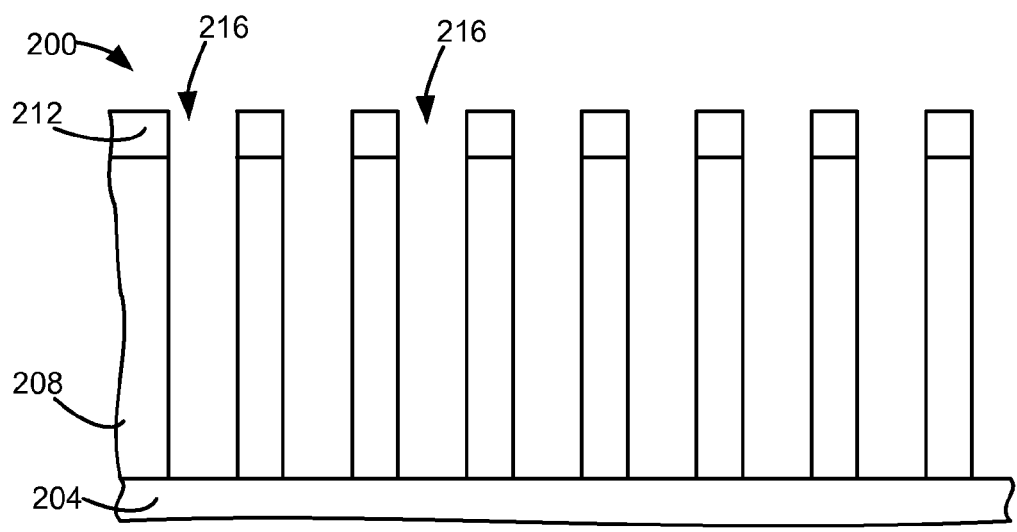

FIG. 2B is a cross-sectional view of the stack 200 after one or more cycles, where features are partially etched. The etching provides features 216. The cycles are continued until a desired etch depth is reached. FIG. 2C is a cross-sectional view of the stack 200 after the features 216 are complete. In this example, the first plasma process is an etch process, the second plasma process is a protective process that provides a protective layer, and the third plasma process is an etch process.

In a first set of test stacks, silicon layers were etched using the above process, but instead of using the transition processes between the first plasma process and the second plasma process and between the second plasma process and the third plasma process a discontinuous plasma was used, which extinguished the plasma between each different plasma process. Extinguishing and then reigniting the plasma between each phase increases process time and increases chances of arcing and creates particulate contaminants, which increases device failure.

In a second set of test stacks, silicon layers were etched using the above process, using a continuous plasma but without the transition processes between the first plasma process and the second plasma process and between the second plasma process and the third plasma process. The resulting etched stacks are thinner than the etched stacks produced in the first set of test stacks. This difference in etch results shows a process shift, which results from the mixing of the gases from different process phases. Without being bound by theory, it is believed that both the oxygen from the second plasma process and fluorine from the first plasma process mixed together increases the trimming of the etched stacks or that the continued presence of fluorine during the second plasma process continues to trim the etched stacks. In addition, mixing of the second process gas and the third process gas causes 1) slower etch rate and 2) RF instability.

In a third set of test stacks, silicon layers were etched using the above process, using a continuous plasma and the transition processes. The resulting etched stacks are thicker than the etched stacks in the second set of test stacks. Without being bound by theory, it is believed that either the transition phase allows the fluorine to be substantially removed before the oxygen plasma phase or more preferably, it is believed that the transition gas, for example $N_2$, helps actively neutralize the fluorine. In this example, it is believed that the $N_2$ actively neutralizes the fluorine by scavenging fluorine ions and radicals generated from fluorine. Ar ions and/or radicals in the second transition step may neutralize oxygen plasma (ions and/or radicals) from the second step, or the second transition step may provide sufficient time for gas exchange between the second plasma process gas and the third plasma process gas without extinguishing the plasma.

This embodiment provides a faster process than processes using a discontinuous plasma, and this embodiment has reduced particle defects than processes using discontinuous plasma. This embodiment also reduces process shift. In this embodiment, the first plasma process provides a bias of 500 or 850 volts to facilitate etching and the transition process does not provide a bias to minimize etching. More generally, the first plasma process provides an etching bias of at least 200 volts, while the transition process provides a low bias of less than 100 volts to minimize etching. In this example, the first plasma process and the second plasma process each are performed for a period of at least 7 times the period of the transition process.

In other embodiments of the invention, a transition gas may actively remove an etch component of the first plasma process gas by chemical reactions with an etching ion/radical, or may cause an electron temperature change. In other embodiments, the plasma from the transition gas is inert to plasma from the first plasma process and the second plasma process at the same time. The etch component of the first plasma process is stopped during or at the end of the first plasma process. In some embodiments, the first plasma process is an etching process and the second plasma process is an etching process. In some embodiments the second plasma process has a period that is less than 100 times the period of the transition process. More preferably, the second plasma process has a period that is less than 50 times the period of the transition process. Most preferably, the second plasma process has a period that is less than 10 times the period of the transition process. In some embodiments the transition gas is inert, in that the transition gas does not etch or deposit and provides nothing to the plasma processing, but helps neutralize a component of the first plasma process gas.

Preferably, the transition process is less than 5 seconds. More preferably, the transition process is less than 3 seconds. Such short transition times allow increased throughput compared to processes that use discontinuous plasmas.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for processing a substrate in a process chamber, comprising:
   providing a plurality of cycles to process the substrate, wherein each cycle comprises the steps of:
      providing a flow of a first process gas into the process chamber;
      performing a first process to etch or provide a protective layer on the substrate with the first process gas;
      stopping the flow of the first process gas into the process chamber;
      providing a flow of a first transition gas into the process chamber;
      neutralizing a component of the first process gas with the first transition gas;
      stopping the flow of the first transition gas into the process chamber;
      providing a flow of a second process gas into the process chamber;
      performing a second process to etch or provide a protective layer on the substrate with the second process gas;
      stopping the flow of the second process gas into the process chamber; and
      maintaining a continuous plasma during the cycle.

2. The method, as recited in claim 1, wherein the first transition gas is flowed for less than 5 seconds each cycle.

3. The method, as recited in claim 1, wherein the providing the flow of the first process gas and the providing the flow for the second process gas are each for a period at least 7 times a period for providing the flow of the first transition gas.

4. The method, as recited in claim 1, wherein the first transition gas is flowed for a period of less than 3 seconds for each cycle.

5. The method, as recited in claim 1, wherein the first transition gas is inert to a plasma formed from the second process gas.

6. The apparatus, as recited in claim 1, wherein the providing the flow of the first process gas and the providing the flow for the second process gas are each for a period at least 7 times a period for providing the flow of the first transition gas.

7. The method of claim 1, wherein the first process is an etching process and the second process provides a protective layer.

8. The method of claim 1, wherein the first process provides a protective layer and the second process provides an etching process.

9. The method, as recited in claim 1, wherein each cycle further comprises providing a flow of a second transition gas into the process chamber, wherein the second transition gas neutralizes a component of the second process gas.

10. The method, as recited in claim 9, wherein each cycle further comprises:
providing a flow of a third process gas into the process chamber; performing a third process to etch or provide a protective layer on the substrate with the third process gas, wherein each step in the cycle is isolated while maintaining the continuous plasma during the cycle.

11. The method, as recited in claim 1, wherein the first process gas comprises an etch component, and wherein the first transition gas comprises a scavenging component which scavenges the etch component.

12. The method, as recited in claim 11, wherein the etch component is fluorine and wherein the scavenging component is $N_2$.

13. The method, as recited in claim 1, further comprising providing a pulsed bias voltage, wherein the pulsed bias voltage provides a higher bias voltage when the flow of the first process gas is provided and provides a lower bias voltage when the flow of the first transition gas is provided.

14. The method, as recited in claim 13, wherein each cycle further comprises providing a flow of a second transition gas into the process chamber, wherein the second transition gas neutralizes a component of the second process gas.

15. The method, as recited in claim 14, wherein the first process gas comprises an etch component, and wherein the first transition gas comprises a scavenging component which scavenges the etch component.

16. The method, as recited in claim 15, wherein the etch component is fluorine and wherein the scavenging component is $N_2$.

17. An apparatus, comprising:
a plasma processing chamber, comprising:
a chamber wall forming a plasma processing chamber enclosure;
a substrate support for supporting a wafer within the plasma processing chamber enclosure;
a pressure regulator for regulating the pressure in the plasma processing chamber enclosure;
at least one electrode for providing power to the plasma processing chamber enclosure for sustaining a plasma;
a gas inlet for providing gas into the plasma processing chamber enclosure; and
a gas outlet for exhausting gas from the plasma processing chamber enclosure;
at least one RF power source electrically connected to the at least one electrode;
a bias voltage source for providing a bias voltage to the substrate support;
a gas source in fluid connection with the gas inlet; and
a controller controllably connected to the gas source, the bias voltage source, and the at least one RF power source, comprising:
at least one processor; and
computer readable media executable by the at least one processor, comprising:
computer readable code configured to direct the plasma processing chamber to provide a plurality of cycles, wherein each cycle comprises the steps of:
providing a flow of a first process gas into the process chamber;
performing a first process to etch or provide a protective layer on the substrate with the first process gas;
stopping the flow of the first process gas into the process chamber;
providing a flow of a first transition gas into the process chamber;
neutralizing a component of the first process gas with the first transition gas;
stopping the flow of the first transition gas into the process chamber;
providing a flow of a second process gas into the process chamber;
performing a second process to etch or provide a protective layer on the substrate with the second process gas;
stopping the flow of the second process gas into the process chamber; and
maintaining a continuous plasma during the cycle.

18. The apparatus, as recited in claim 17, wherein the computer readable media further comprises computer readable code for providing a pulsed bias voltage, wherein the pulsed bias voltage provides a higher bias voltage when the flow of the first process gas is provided and provides a lower bias voltage when the flow of the first transition gas is provided.

19. The apparatus, as recited in claim 17, wherein each cycle further comprises providing a flow of a second transition gas into the process chamber, wherein the second transition gas neutralizes a component of the second process gas.

20. The method, as recited in claim 19, wherein each cycle further comprises providing a flow of a third process gas into the process chamber; performing a third process to etch or provide a protective layer on the substrate with the third process gas, wherein each step in the cycle is isolated while maintaining the continuous plasma during the cycle.

21. The apparatus, as recited in claim 17, wherein the first process gas comprises an etch component, and wherein the first transition gas comprises a scavenging component which scavenges the etch component.

22. The apparatus, as recited in claim 21, wherein the etch component is fluorine and wherein the scavenging component is $N_2$.

* * * * *